United States Patent
Lian et al.

(10) Patent No.: US 11,680,986 B2
(45) Date of Patent: Jun. 20, 2023

(54) METHOD AND DEVICE FOR DETERMINING CLOSING TIME OF CIRCUIT BREAKER, AND COMPUTER-READABLE MEDIUM

(71) Applicant: Siemens Aktiengesellschaft, Munich (DE)

(72) Inventors: Hai Tao Lian, Nanjing (CN); Fei Wang, Nanjing (CN); Liang Shen, Munich (DE); Ling Xi Li, Munich (DE); Hui Nan Mei, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 128 days.

(21) Appl. No.: 17/190,878

(22) Filed: Mar. 3, 2021

(65) Prior Publication Data
US 2021/0278463 A1    Sep. 9, 2021

(30) Foreign Application Priority Data
Mar. 9, 2020  (CN) .......................... 202010157906.X

(51) Int. Cl.
*G01R 31/327*    (2006.01)
(52) U.S. Cl.
CPC .................. *G01R 31/327* (2013.01)
(58) Field of Classification Search
CPC ........ G01R 31/32; G01R 31/327; H01H 1/56; H01H 9/56; H01H 9/563; H01H 2009/566
See application file for complete search history.

(56) References Cited

U.S. PATENT DOCUMENTS 10,438,757 B2   10/2019  Talluri
2018/0358189 A1 * 12/2018  Mori ...................... H01H 33/59

FOREIGN PATENT DOCUMENTS

CN    109932646 A  *  6/2019
JP    2008529227 A  *  7/2008  ............... H01H 9/56

OTHER PUBLICATIONS

Extended European Search Report dated Jul. 30, 2021.

* cited by examiner

*Primary Examiner* — Son T Le
(74) *Attorney, Agent, or Firm* — Harness, Dickey & Pierce, P.L.C.

(57) ABSTRACT

A method, device and computer readable medium are provided for determining the closing time of a circuit breaker. In an embodiment, the method includes: sampling a voltage signal of a target phase in the three-phase voltage signal of the circuit breaker; determining a first time period according to a voltage value of the sampled voltage signal, a voltage signal in the first time period including a voltage jump point of the voltage value; finding a voltage jump point of a voltage value in the first time period according to a change in the voltage value of the voltage signal in the first time period; and determining the closing time of a target phase of the circuit breaker according to the found sampling time of the voltage jump point.

20 Claims, 11 Drawing Sheets

METHOD AND DEVICE FOR DETERMINING CLOSING TIME OF CIRCUIT BREAKER, AND COMPUTER-READABLE MEDIUM

PRIORITY STATEMENT

The present application hereby claims priority under 35 U.S.C. § 119 to Chinese patent application number CN 202010157906.X filed Mar. 9, 2020, the entire contents of each of which are hereby incorporated herein by reference.

FIELD

Embodiments of the present invention generally relate to the technical field of power systems, in particular to a method and device for determining the closing time of a circuit breaker, and a computer-readable medium.

BACKGROUND

In a power system, the input end of a circuit breaker may be connected to a transformer, and the output end thereof may be connected to a load. When the circuit breaker is closed, a closed circuit is formed from the transformer to the circuit breaker to the load, and thus the transformer can provide three-phase voltage to the load through the circuit breaker. When the circuit breaker is closed, overvoltage or surge often occurs, which has a significant adverse effect on the load.

In order to avoid such adverse effects, it is necessary to control the phase angle of the three-phase voltage output when the circuit breaker is switched on. Specifically, the time of issuance of a closing instruction for controlling the closing of the circuit breaker may be adjusted according to the closing time of each phase voltage signal output by the circuit breaker, thereby allowing the control of the phase angle of the three-phase voltage output by the circuit breaker. How to determine the closing time of any phase voltage signal of a circuit breaker is very important.

At present, the closing time of any phase voltage signal of a circuit breaker is determined mainly by: monitoring a voltage signal of a target phase output by the circuit breaker, determining the time when the voltage signal of the target phase is greater than or equal to a fixed threshold value for the first time as the switch-on time of the circuit breaker, and taking the length of time from the time the circuit breaker receives the closing instruction to the switch-on time as the closing time of the target phase of the circuit breaker.

SUMMARY

The inventors have discovered that with the abovementioned method, the closing time of each phase of the circuit breaker cannot be determined accurately.

Embodiments of the present invention provide a method and device for determining the closing time of a circuit breaker, and a computer-readable medium, capable of determining more accurately the closing time of each phase of a circuit breaker.

In a first aspect, an embodiment of the present invention provides a method for determining the closing time of a circuit breaker, the circuit breaker outputting a three-phase voltage signal, the method comprising:

sampling a voltage signal of a target phase in the three-phase voltage signal of the circuit breaker;

determining a first time period according to a voltage value of the sampled voltage signal, a voltage signal in the first time period comprising a voltage jump point of the voltage value;

finding a voltage jump point of the voltage value in the first time period according to a change in the voltage value of the voltage signal in the first time period; and determining the closing time of a target phase of the circuit breaker according to the found sampling time of the voltage jump point.

In a second aspect, an embodiment of the present invention provides a device for determining the closing time of a circuit breaker, the circuit breaker outputting a three-phase voltage signal, comprising:

a sampling module configured to sample a voltage signal of a target phase in the three-phase voltage signal of the circuit breaker;

a first time period determination module configured to determine a first time period according to a voltage value of the sampled voltage signal, a voltage signal in the first time period comprising a voltage jump point of a voltage value;

a jump point search module configured to find a voltage jump point of a voltage value in the first time period according to a change in a voltage value of the voltage signal in the first time period; and a first closing time determination module configured to determine the closing time of the target phase of the circuit breaker according to the found sampling time of the voltage jump point.

In a third aspect, an embodiment of the present invention provides a device for determining the closing time of a circuit breaker, comprising: at least one memory and at least one processor;

the at least one memory is configured to store a machine-readable program; and the at least one processor is configured to invoke the machine-readable program to implement any one of the methods described in the first aspect.

In a fourth aspect, an embodiment of the present invention provides a computer-readable medium, characterized in that the computer-readable medium stores a computer instruction that, when executed by a processor, causes the processor to implement any one of the methods described in the first aspect.

In another aspect, an embodiment of the present invention provides a method for determining a closing time of a circuit breaker, the circuit breaker being configured to output a three-phase voltage signal, the method comprising:

sampling a voltage signal of a target phase in the three-phase voltage signal of the circuit breaker;

determining a first time period according to a voltage value of the voltage signal sampled, a voltage signal in the first time period comprising a voltage jump point of the voltage value;

finding a voltage jump point of the voltage value in the first time period according to a change in the voltage value of the voltage signal in the first time period; and determining a closing time of a target phase of the circuit breaker according to a sampling time found, of the voltage jump point.

In another aspect, an embodiment of the present invention provides a device for determining a closing time of a circuit breaker, the circuit breaker being configured to output a three-phase voltage signal, the device comprising:

a sampling module configured to sample a voltage signal of a target phase in the three-phase voltage signal of the circuit breaker;

a first time period determination module configured to determine a first time period according to a voltage value of the voltage signal sampled, a voltage signal in the first time period including a voltage jump point of a voltage value;

a jump point search module configured to find a voltage jump point of a voltage value in the first time period according to a change in a voltage value of the voltage signal in the first time period; and a first closing time determination module configured to determine a closing time of a target phase of the circuit breaker according to the sampling time found, of the voltage jump point.

In another aspect, an embodiment of the present invention provides a device for determining the closing time of a circuit breaker, comprising:

at least one memory configured to store a machine-readable program; and at least one processor configured to invoke the machine-readable program for implementing at least sampling a voltage signal of a target phase in the three-phase voltage signal of a circuit breaker;

determining a first time period according to a voltage value of the voltage signal sampled, a voltage signal in the first time period comprising a voltage jump point of the voltage value;

finding a voltage jump point of the voltage value in the first time period according to a change in the voltage value of the voltage signal in the first time period; and determining a closing time of a target phase of the circuit breaker according to a sampling time found, of the voltage jump point.

In another aspect, an embodiment of the present invention provides a non-transitory computer-readable medium, storing a computer instruction that, when executed by a processor, causes the processor to implement the method of an embodiment.

BRIEF DESCRIPTION OF THE DRAWINGS

To illustrate more clearly the technical solutions according to the embodiments or in the prior art, the accompanying drawings for describing the embodiments or the prior art are described briefly below. Apparently, the accompanying drawings in the following description are only some embodiments of the present invention, and those of ordinary skill in the art can derive other drawings from the accompanying drawings without creative efforts.

List of reference numerals in the figures.

Figure 1:
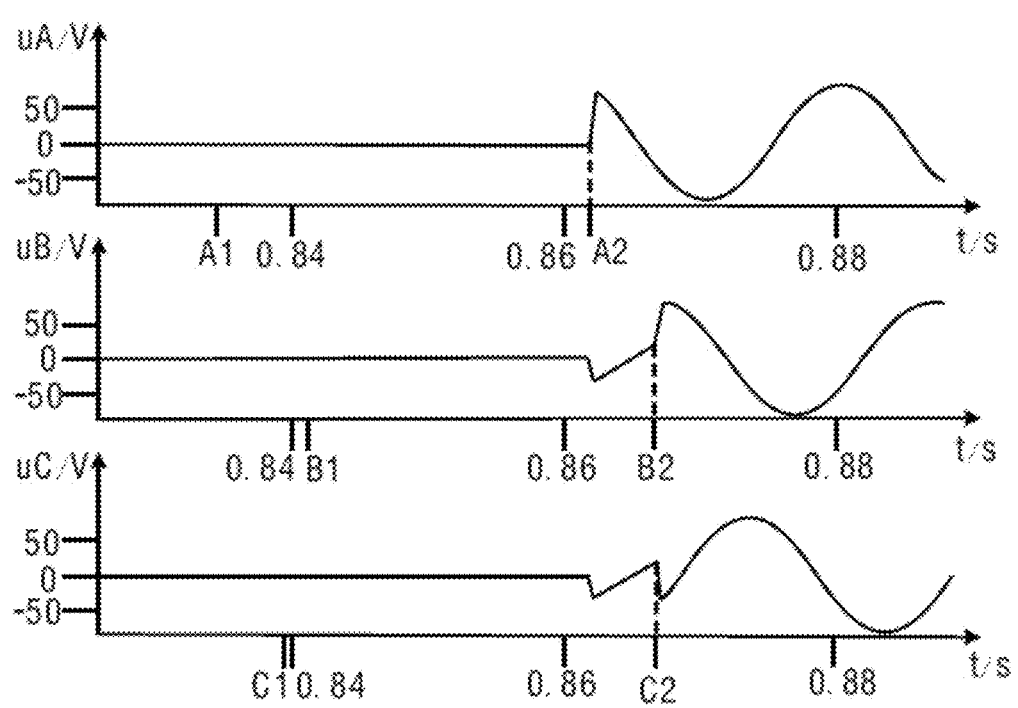
FIG. 1 is a waveform diagram for a phase A voltage signal, a phase B voltage signal, and a phase C voltage signal output by a circuit breaker according to an embodiment of the present invention.

701: Sampling module
702: First time period determination module
703: Jump point search module
704: First closing time determination module
7021: Voltage value determination unit
7022: Second time period determination unit
7023: Reference time determination unit
7024: First time period determination unit
70241: Start time determination subunit
70242: End time determination subunit
70243: First time period determination subunit
7041: First time determination unit
7042: Second time determination unit
7043: Closing data determination unit
1101: First time determination module
1102: Second time period determination module
1103: Target sampling time determination module
1104: Second closing time determination module

DETAILED DESCRIPTION OF EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

In a first aspect, an embodiment of the present invention provides a method for determining the closing time of a circuit breaker, the circuit breaker outputting a three-phase voltage signal, the method comprising:

sampling a voltage signal of a target phase in the three-phase voltage signal of the circuit breaker;

determining a first time period according to a voltage value of the sampled voltage signal, a voltage signal in the first time period comprising a voltage jump point of the voltage value;

finding a voltage jump point of the voltage value in the first time period according to a change in the voltage value of the voltage signal in the first time period; and determining the closing time of a target phase of the circuit breaker according to the found sampling time of the voltage jump point.

In a first possible implementation manner, in conjunction with the above-described first aspect, the determining a first time period according to a voltage value of the sampled voltage signal comprises:

determining the absolute value of a voltage value of the sampled voltage signal;

determining a second time period during which the absolute value of the voltage value is greater than or equal to a first preset voltage threshold value for n seconds consecutively for the first time, where n is a preset positive number and the first preset voltage threshold value is a positive number;

determining any time in the second time period as the jump reference time; and determining the first time period according to the jump reference time.

In a second possible implementation manner, in conjunction with the first possible implementation manner in the first aspect, the determining any time in the second time period as the jump reference time comprises:

determining the time at which the second time period ends as the jump reference time.

In a third possible implementation manner, in conjunction with the first possible implementation manner in the first aspect, the value range of the first preset voltage threshold value is [v1, v2], where v1 is 0.2 times the rated secondary voltage of the transformer that inputs the three-phase voltage signal to the circuit breaker, and v2 is the maximum value of a voltage signal of a target phase input to the circuit breaker.

In a fourth possible implementation manner, in conjunction with the first possible implementation manner in the first aspect, the value range of n is [0.003, 0.006].

In a fifth possible implementation manner, in conjunction with the abovementioned first aspect, the determining the first time period according to the jump reference time comprises:

taking the time p voltage cycles before the jump reference time as the start time;

taking the time q voltage cycles after the jump reference time as the end time; and determining the time period from the start time to the end time as the first time period, wherein p and q are positive numbers, and the voltage cycle is the cycle of a voltage signal of a target phase input to the circuit breaker.

In a sixth possible implementation manner, in conjunction with the abovementioned first aspect, the finding a voltage jump point of a voltage value in the first time period according to a change in the voltage value of the voltage signal in the first time period comprises:

for each voltage value of the voltage signal of the target phase in the first time period, determining a first slope of the current voltage value on a first curve, the first curve comprising a curve between the previous voltage value of the current voltage value and the current voltage value;

determining a second slope of the current voltage value on a second curve, the second curve comprising a curve between the next voltage value of the current voltage value and the current voltage value;

determining whether the current voltage value satisfies the following condition: the absolute value of the first slope corresponding to the current voltage value is smaller than a preset slope, and the absolute value of the second slope corresponding to the current voltage value is greater than or equal to the preset slope; if yes, it is determined that the current voltage value is a voltage jump point; otherwise, it is determined that the current voltage value is not a voltage jump point, wherein the preset slope is a positive number.

In a seventh possible implementation manner, in conjunction with the abovementioned first aspect, the determining the closing time of a target phase of the circuit breaker according to the found sampling time of the voltage jump point comprises:

determining a first time when the circuit breaker receives a closing instruction corresponding to the target phase;

determining a second time when the last voltage jump point appears in the first time period; and taking the length of time between the first time and the second time as the closing time of the target phase of the circuit breaker.

In an eighth possible implementation manner, in conjunction with the above-described first aspect, the first possible implementation manner in the first aspect, the second possible implementation manner in the first aspect, the third possible implementation manner in the first aspect, the fourth possible implementation manner in the first aspect, the fifth possible implementation manner in the first aspect, the sixth possible implementation manner in the first aspect, and the seventh possible implementation manner in the first aspect, the method further comprises:

determining a first time when the circuit breaker receives a closing instruction corresponding to the target phase;

determining the absolute value of a voltage value of the sampled voltage signal, and determining a second time period during which the absolute value of the voltage value is greater than or equal to a first preset voltage threshold value for n seconds consecutively for the first time;

if the voltage jump point is not found within the first time period, searching, from back to front, the time period before the start time of the second time period to determine the first target sampling time found that is smaller than or equal to a voltage value of a second preset voltage threshold value; and taking the length of time between the first time and the target sampling time as the closing time of the target phase of the circuit breaker, wherein n is a preset positive number, and both the first preset voltage threshold value and the second preset voltage threshold value are positive numbers.

In a second aspect, an embodiment of the present invention provides a device for determining the closing time of a circuit breaker, the circuit breaker outputting a three-phase voltage signal, comprising:

a sampling module configured to sample a voltage signal of a target phase in the three-phase voltage signal of the circuit breaker;

a first time period determination module configured to determine a first time period according to a voltage value of the sampled voltage signal, a voltage signal in the first time period comprising a voltage jump point of a voltage value;

a jump point search module configured to find a voltage jump point of a voltage value in the first time period according to a change in a voltage value of the voltage signal in the first time period; and a first closing time determination module configured to determine the closing time of the target phase of the circuit breaker according to the found sampling time of the voltage jump point.

In a first possible implementation manner, in conjunction with the abovementioned second aspect, the first time period determination module comprises:

a voltage value determination unit configured to determine the absolute value of a voltage value of the sampled voltage signal;

a second time period determination unit configured to determine a second time period during which the absolute value of the voltage value is greater than or equal to a first preset voltage threshold value for n seconds consecutively for the first time, where n is a preset positive number and the first preset voltage threshold value is a positive number;

a reference time determination unit configured to determine any time in the second time period as a jump reference time; and a first time period determination unit configured to determine the first time period according to the jump reference time.

In a second possible implementation manner, in conjunction with the first possible implementation manner in the second aspect, the reference time determination unit is configured to determine the time at which the second time period ends as the jump reference time.

In a third possible implementation manner, in conjunction with the first possible implementation manner in the second aspect, the value range of the first preset voltage threshold value is [v1, v2), where v1 is 0.2 times the rated secondary voltage of the transformer that inputs the three-phase voltage signal to the circuit breaker, and v2 is the maximum value of a voltage signal of a target phase input to the circuit breaker.

In a fourth possible implementation manner, in conjunction with the first possible implementation manner in the second aspect, the value range of n is [0.003, 0.006].

In a fifth possible implementation manner, in conjunction with the abovementioned second aspect, the first time period determination unit comprises:

a start time determination subunit configured to take the time p voltage cycles before the jump reference time as the start time;

an end time determination subunit configured to take the time q voltage cycles after the jump reference time as the end time; and a first time period determination subunit configured to determine the time period from the start time to the end time as the first time period, wherein p and q are positive numbers, and the voltage cycle is the cycle of a voltage signal of a target phase input to the circuit breaker.

In a sixth possible implementation manner, in conjunction with the abovementioned second aspect, the jump point search module is configured to, for each voltage value of the voltage signal of the target phase in the first time period:

determine a first slope of the current voltage value on a first curve, the first curve comprising a curve between the previous voltage value of the current voltage value and the current voltage value;

determine a second slope of the current voltage value on a second curve, the second curve comprising a curve between the next voltage value of the current voltage value and the current voltage value;

determine whether the current voltage value satisfies the following condition: the absolute value of the first slope corresponding to the current voltage value is smaller than a preset slope, and the absolute value of the second slope corresponding to the current voltage value is greater than or equal to the preset slope; if yes, it is determined that the current voltage value is a voltage jump point; otherwise, it is determined that the current voltage value is not a voltage jump point, wherein the preset slope is a positive number.

In a seventh possible implementation manner, in conjunction with the above-described second aspect, the first closing time determination module comprises:

a first time determination unit configured to determine a first time when the circuit breaker receives a closing instruction corresponding to the target phase;

a second time determination unit configured to determine a second time when the last voltage jump point appears in the first time period; and a closing data determination unit configured to take the length of time between the first time and the second time as the closing time of the target phase of the circuit breaker.

In an eighth possible implementation manner, in conjunction with the above-described second aspect, the first possible implementation manner in the second aspect, the second possible implementation manner in the second aspect, the third possible implementation manner in the second aspect, the fourth possible implementation manner in the second aspect, the fifth possible implementation manner in the second aspect, the sixth possible implementation manner in the second aspect, and the seventh possible implementation manner in the second aspect, the device further comprises:

a first time determination module configured to determine a first time when the circuit breaker receives a closing instruction corresponding to the target phase;

a second time period determination module configured to determine the absolute value of a voltage value of the sampled voltage signal, and determine a second time period during which the absolute value of the voltage value is greater than or equal to a first preset voltage threshold value for n seconds consecutively for the first time;

a target sampling time determination module configured to, if the jump point search module fails to find the voltage jump point within the first time period, search, from back to front, the time period before the start time of the second time period to determine the first target sampling time found that is smaller than or equal to a voltage value of a second preset voltage threshold value; and a second closing time determination module configured to take the length of time between the first time and the target sampling time as the closing time of the target phase of the circuit breaker, wherein n is a preset positive number, and both the first preset voltage threshold value and the second preset voltage threshold value are positive numbers.

In a third aspect, an embodiment of the present invention provides a device for determining the closing time of a circuit breaker, comprising: at least one memory and at least one processor;

the at least one memory is configured to store a machine-readable program; and the at least one processor is configured to invoke the machine-readable program to implement any one of the methods described in the first aspect.

In a fourth aspect, an embodiment of the present invention provides a computer-readable medium, characterized in that the computer-readable medium stores a computer instruction that, when executed by a processor, causes the processor to implement any one of the methods described in the first aspect.

In an embodiment of the present invention, a voltage jump point is searched according to a change in the voltage value of a voltage signal of a target phase; when a circuit breaker switches on any phase voltage signal, a jump of the voltage signal occurs; in other words, the switch-on time of a target phase of the circuit breaker is at the voltage jump point of the voltage signal of the target phase; by finding a voltage jump point from a voltage signal of the target phase and based on the sampling time of the voltage jump point, the closing time of the target phase of the circuit breaker may be determined more accurately.

In order to describe more clearly the objectives, technical solutions, and advantages of embodiments of the present invention, the technical solutions in embodiments of the present invention will be explained clearly and completely below with reference to the drawings for embodiments of the present invention. Obviously, the described embodiments are only some, but not all, embodiments of the present invention. Any embodiments obtained by those of ordinary skill in the art based on the described embodiments of the present invention without making inventive efforts fall into the protection scope of the present invention.

After any one phase voltage signal among three-phase voltage signals output by a circuit breaker is switched on, disturbance will be caused to a voltage signal of another phase that has not been switched on. In an existing solution for determining the closing time, the time when a voltage signal of a target phase is greater than or equal to a fixed threshold value for the first time is determined as the switch-on time of the target phase of the circuit breaker. If the fixed threshold value is small, the time when it is greater than or equal to the fixed threshold value for the first time may be the time of disturbance; If the fixed threshold value is large, the time when it is greater than or equal to the fixed threshold value for the first time will be far from the actual switch-on time.

FIG. 1 shows a waveform diagram for a phase A voltage signal, a phase B voltage signal, and a phase C voltage signal output by a circuit breaker before and after the circuit breaker is closed, phase A, phase B, and phase C being shown in turn from top to bottom. In FIG. 1, the abscissa t represents time in s (seconds), the ordinate represents voltage in V (volts), uA represents phase A voltage, uB represents phase B voltage, and uC represents phase C voltage. For a voltage signal of phase A, the precise switch-on time of the voltage signal of phase A may not be determined unless the fixed threshold is very low. Since any one phase voltage signal will cause interference to voltage signals of other phases after being switched on, when the fixed threshold value is very low, the time corresponding to an interference signal will be taken as the switch-on time. As shown in FIG. 1, for the voltage signal of phase B and the voltage signal of phase C, the waveform generated before the switch-on time of the voltage signal of phase B and the voltage signal of phase C is the interference signal generated after the voltage signal of phase A is switched on; if the fixed threshold is very low, a interference signal of the voltage signal of phase B and the voltage signal of phase C will be greater than or equal to the fixed threshold, and the switch-on time determined by the fixed threshold value is in the interference signal phase; consequently, the accurate switch-on time cannot be determined. As shown in FIG. 1, the circuit breaker receives a closing instruction of a voltage signal of phase A at time A1, the real switch-on time of the voltage signal of phase A is at time A2, and the closing time of the voltage signal of phase A is the length of time from time A1 to time A2. As shown in FIG. 1, the circuit breaker receives a closing instruction of the voltage signal of phase B at time B1, the real switch-on time of the voltage signal of phase B is at time B2, and the closing time of the voltage signal of phase B is the length of time from time B1 to time B2. As shown in FIG. 1, the circuit breaker receives a closing instruction of the voltage signal of phase C at time C1, the real switch-on time of the voltage signal of phase C is at time C2, and the closing time of the voltage signal of phase C is the length of time from time C1 to time C2.

According to the voltage signal of phase A, the voltage signal of phase B, and the voltage signal of phase C shown in FIG. 1, it is clear that the closing time of the circuit breaker cannot be accurately determined regardless of whether a high fixed threshold or a low fixed threshold is set.

Figure 2:
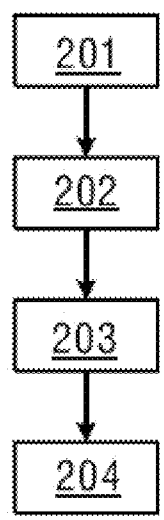
FIG. 2 is a flowchart for a method for determining the closing time of a circuit breaker according to an embodiment of the present invention.

In order to allow more accurate determination of the closing time of each phase of a circuit breaker, as shown in FIG. 2, an embodiment of the present invention provides a method for determining the closing time of a circuit breaker, the circuit breaker outputting a three-phase voltage signal, the method comprising the following steps:

Step 201: sampling a voltage signal of a target phase in the three-phase voltage signal of the circuit breaker;

Step 202: determining a first time period according to the voltage value of the sampled voltage signal, a voltage signal in the first time period comprising a voltage jump point of the voltage value;

Step 203: finding a voltage jump point of a voltage value in the first time period according to a change in a voltage value of the voltage signal in the first time period; and Step 204: determining the closing time of a target phase of the circuit breaker according to the found sampling time of the voltage jump point.

In an embodiment of the present invention, a voltage jump point is searched according to a change in the voltage value of a voltage signal of a target phase; when a circuit breaker switches on any phase voltage signal, a jump of the voltage signal occurs; in other words, the switch-on time of a target phase of the circuit breaker is at the voltage jump point of the voltage signal of the target phase; by finding a voltage jump point from a voltage signal of the target phase and based on the sampling time of the voltage jump point, the closing time of the target phase of the circuit breaker may be determined more accurately.

In an embodiment of the present invention, the input terminal of a circuit breaker may be connected to a transformer, which provides a three-phase voltage signal to the circuit breaker; the output terminal of the circuit breaker may be connected to a load, and the circuit breaker can output a three-phase voltage signal to the load after being switched on.

A method for determining the closing time of a circuit breaker provided by an embodiment of the present invention is suitable for determining the closing time of any phase voltage signal.

For sampling a three-phase voltage signal output by a circuit breaker, the value range of the sampling frequency may be [1 kHz, 8 kHz]. In the process of sampling, record the voltage value of each sampling and the sampling time of each sampling. How a circuit breaker specifically collects a voltage signal of a target phase belongs to the prior art and will not be described again herein.

Since the switch-on time of the circuit breaker is within the time period during which a voltage signal starts, if all the time periods of the voltage signal are searched for a voltage jump point, it will take a long time and the processing efficiency is low. Therefore, it is necessary to determine a jump reference time, determine a first time period based on the jump reference time, and search for a voltage jump point within the first time period only; since the search range is narrowed, the desired voltage jump point may be found quickly. Jump reference time mentioned herein refers to the nearby time corresponding to a voltage jump point; when the jump reference time is found, the first time period including the jump reference time may be determined.

In an embodiment of the present invention, a voltage jump point refers to a point at which the curve of a voltage signal takes a major turn. For example, the slope of the curve of the voltage signal before the voltage jump point is 1, and the slope of the curve after the voltage jump point is 5. As shown in FIG. 1, the point at time A2, the point at time B2, and the point at time C2 in the figure are all voltage jump points.

In an embodiment of the present invention, determining a first time period according to a voltage value of a sampled voltage signal comprises:

determining the absolute value of the voltage value of the sampled voltage signal;

determining a second time period during which the absolute value of the voltage value is greater than or equal to a first preset voltage threshold value for n seconds consecutively for the first time, where n is a preset positive number and the first preset voltage threshold value is a positive number;

determining any time in the second time period as a jump reference time; and determining the first time period according to the jump reference time.

In an embodiment of the present invention, when the absolute value of the voltage value of a target phase is greater than or equal to a first preset voltage threshold value for n seconds consecutively, it indicates that the voltage signal of the target phase has been switched on or the voltage signal of the target phase has been disturbed by an impact produced when another phase is switched on.

Figure 3:
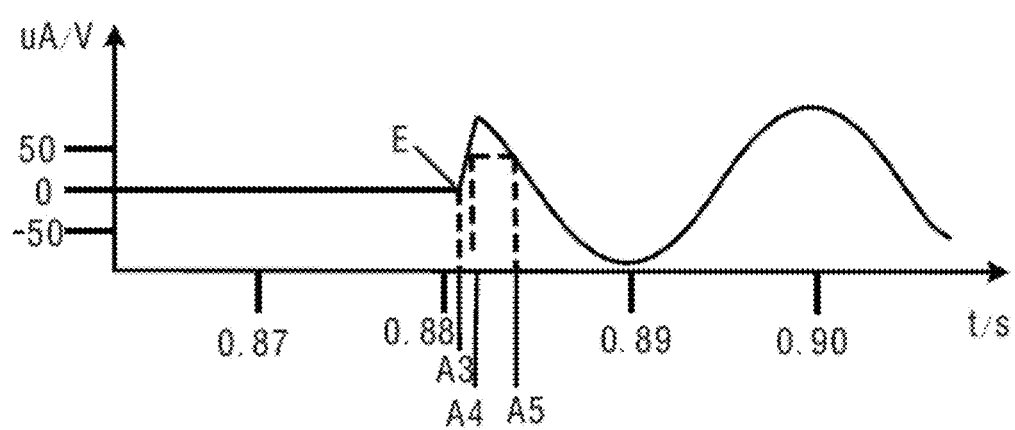
FIG. 3 is a waveform diagram for a phase A voltage signal output by a circuit breaker according to an embodiment of the present invention.

In the case where the second time period begins after the voltage signal of the target phase has been switched on, since the second time period is the time period during which the voltage signal is greater than or equal to a first preset voltage threshold value for n seconds consecutively, it indicates that the switch-on time is near the second time period; therefore, a jump reference time may be determined according to any time in the second time period; then, the first time period is determined on the basis of the jump reference time, and the switch-on time may be found quickly from the first time period. FIG. 3 shows a waveform diagram for the voltage signal of phase A output by the circuit breaker; the voltage signal of phase A is switched on at time A3; in FIG. 3, n is 0.003 seconds; the voltage signal of phase A in FIG. 3 is greater than or equal to a first preset voltage threshold value between time A4 and time A5 for 0.003 seconds consecutively for the first time, and the time period from time A4 to time A5 is the second time period; it is clear that the second time period is after time A3, namely, the switch-on time of the voltage signal of phase A, and that time A3, namely, the switch-on time of the voltage signal of phase A, is near the second time period. The point E corresponding to time A3 in FIG. 3 is a voltage jump point of the voltage signal of phase A.

Figure 4:
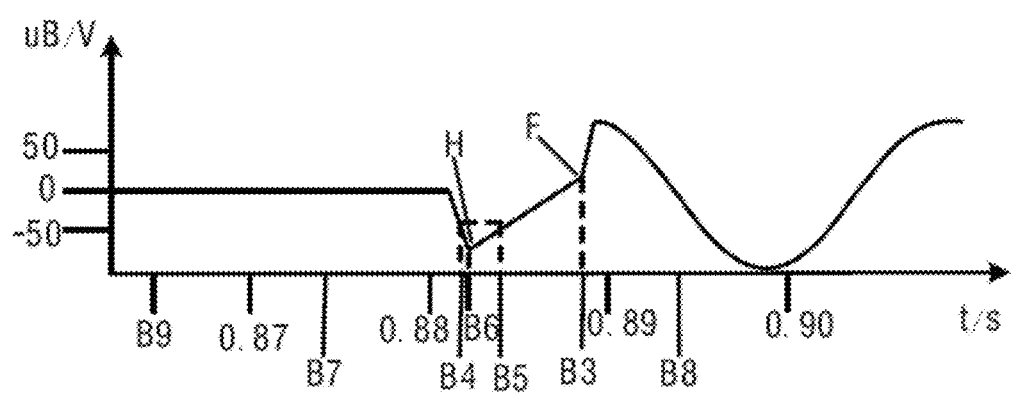
FIG. 4 is a waveform diagram for a phase B voltage signal output by a circuit breaker according to an embodiment of the present invention.

In a case where the voltage signal of a target phase in the second time period is disturbed due to the impact produced when the voltage signal of another phase is switched on, since the second time period appears during disturbance, it indicates that one phase of the circuit breaker has been switched on; based on the operating principle of the circuit breaker, after one of the phases is switched on, the other phases will also be switched on soon; therefore, the switch-on time of the target phase is near the second time period; thus, a jump reference time may be determined based on any time in the second time period; then, the first time period is determined based on the jump reference time, and the switch-on time may be quickly found from the first time period. FIG. 4 shows a waveform diagram for the voltage signal of phase B output by the circuit breaker; the voltage signal of phase B is switched on at time B3, and the waveform before time B3 is a disturbance waveform; in FIG. 4, n is 0.003 seconds; the voltage signal of phase B in the figure is greater than or equal to a first preset voltage threshold value between time B4 and time B5 for 0.003 seconds consecutively for the first time, and the time period from time B4 to time B5 is the second time period; it is clear that the second time period is in the disturbance waveform of the voltage signal of phase B, and time B3, namely, the switch-on time of the voltage signal of phase B, is near the second time period. FIG. 4 shows two voltage jump points of the voltage signal of phase B: point F corresponding to time B3 and point H corresponding to time B6. FIG. 4 also shows a first time period that starts at time B7 and ends at time B8. FIG. 4 also shows the first time when the circuit breaker receives a closing instruction corresponding to phase B; the first time is time B9 shown in FIG. 4. Then, the time period from time B9 to time B3 is the closing time of the voltage signal of phase B.

In summary, in any circumstance, the switch-on time of the target phase is near the second time period; the first time period is determined based on the second time period, and the switch-on time may be quickly found from the first time period.

In an embodiment of the present invention, determining any time in a second time period as a jump reference time comprises:

determining the time at which the second time period ends as a jump reference time.

In an embodiment of the present invention, the time at which the second time period ends is used as a jump reference time. For example, time A5 in FIG. 3 may be used as a jump reference time, and time B5 in FIG. 4 may be used as a jump reference time.

In addition, the time when the second time period starts may also be used as a jump reference time. For example, time A4 in FIG. 3 may be used as a jump reference time, and time B4 in FIG. 4 may be used as a jump reference time.

In an embodiment of the present invention, the value range of the first preset voltage threshold value is [v1, v2), where v1 is 0.2 times the rated secondary voltage of the transformer that inputs the three-phase voltage signal to the circuit breaker, and v2 is the maximum value of a voltage signal of a target phase input to the circuit breaker.

In an embodiment of the present invention, a first preset voltage threshold value cannot be greater than or equal to the maximum value of the voltage signal of a target phase input to the circuit breaker; if it is greater than or equal to the maximum value, a second time period greater than or equal to the first preset voltage threshold value cannot be found. A first preset voltage threshold value is also preferably not smaller than v1; if it is smaller than v1, the found second time period distance is likely located in the noise waveform of the voltage signal of the target phase, and the switch-on time is far from the second time period; when a search is performed for a voltage jump point in the first time period, it may not be possible to find the accurate switch-on time. The maximum value of the voltage signal of the target phase is the peak value of the voltage signal of the target phase after the circuit breaker switches on the target phase.

It should be noted that after a transformer has performed voltage transformation, the secondary side of the transformer outputs a three-phase voltage signal that is then input to the circuit breaker. For example, if the rated secondary voltage of the transformer is 100v, then v1 is 20v.

In an embodiment of the present invention, the value range of n is [0.003, 0.006].

In an embodiment of the present invention, determining the first time period according to a jump reference time comprises:

taking the time p voltage cycles before the jump reference time as the start time;

taking the time q voltage cycles after the jump reference time as the end time; and determining the time period from the start time to the end time as the first time period, wherein p and q are positive numbers, and the voltage cycle is the cycle of a voltage signal of a target phase input to the circuit breaker.

In an embodiment of the present invention, the voltage signal of each phase input to the circuit breaker changes periodically, and the voltage signal of each phase input to the circuit breaker has a corresponding cycle. For example, if the frequency of the voltage signal of the target phase input to the circuit breaker is 50 Hz, then the cycle of the voltage signal is 0.02 seconds.

In an embodiment of the present invention, a first time period is determined by extending to both sides of a jump reference time based on the jump reference time. For example, the value of p is 1, 1.5, 2, 2.5, 3, etc., and the value of q is 1, 1.5, 2, 2.5, 3, etc.

In an embodiment of the present invention, finding a voltage jump point of a voltage value in the first time period according to a change in the voltage value of the voltage signal in the first time period comprises:

for each voltage value of the voltage signal of the target phase in the first time period, determining a first slope of the current voltage value on a first curve, the first curve comprising a curve between the previous voltage value of the current voltage value and the current voltage value;

determining a second slope of the current voltage value on a second curve, the second curve comprising a curve between the next voltage value of the current voltage value and the current voltage value;

determining whether the current voltage value satisfies the following condition: the absolute value of the first slope corresponding to the current voltage value is smaller than a preset slope, and the absolute value of the second slope corresponding to the current voltage value is greater than or equal to the preset slope; if yes, it is determined that the current voltage value is a voltage jump point; otherwise, it is determined that the current voltage value is not a voltage jump point, where the preset slope is a positive number.

In an embodiment of the present invention, a first slope and a second slope may be determined simply on the basis of two voltage values adjacent to the current voltage value.

Specifically, a first slope of the current voltage value on a first curve may be determined according to the following formula:

$$k_1 = \frac{v_d - v_e}{t_d - t_e},$$

where $k_1$ is the first slope, $v_d$ is the current voltage value, $v_e$ is the previous voltage value of the current voltage value, $t_d$ is the sampling time of the current voltage value, and $t_e$ is the sampling time of the previous voltage value of the current voltage value.

Specifically, a second slope of the current voltage value on a second curve may be determined according to the following formula:

$$k_2 = \frac{v_f - v_d}{t_f - t_d},$$

where $k_2$ is the second slope, $v_d$ is the current voltage value, $v_f$ is the next voltage value of the current voltage value, $t_d$ is the sampling time of the current voltage value, and $t_f$ is the sampling time of the next voltage value of the current voltage value.

When the absolute value of a first slope is smaller than a preset slope, and the absolute value of a second slope is greater than or equal to a preset slope, it indicates that the current voltage value is a turning point. Moreover, after a target phase of a circuit breaker is switched on, the voltage signal of the target phase will quickly reach the voltage signal input by the transformer; in other words, within a relatively short time after the switch-on time, the slope of the voltage signal of the target phase is very large; therefore, a voltage jump point needs to satisfy the condition that the absolute value of the second slope is greater than or equal to a preset slope; only the sampling time of such a voltage jump point may be the switch-on time.

For the voltage signal of phase A shown in FIG. 3, the absolute value of the first slope on the curve to the left of point E at point E (that is, the curve between the previous voltage value at point E and point E) is smaller than the preset slope, and the absolute value of the second slope on the curve to the right of point E at point E (that is, the curve between the next voltage value of point E and point E) is greater than or equal to the preset slope; therefore, point E is a voltage jump point of the voltage signal of phase A.

For the voltage signal of phase B shown in FIG. 4, the absolute value of the first slope on the curve to the left of point F at point F (that is, the curve between the previous voltage value at point F and point F) is smaller than the preset slope, and the absolute value of the second slope on the curve to the right of point F at point F (that is, the curve between the next voltage value of point F and point F) is greater than or equal to the preset slope; therefore, point F is a voltage jump point of the voltage signal of phase B. The absolute value of the first slope on the curve to the left of point H at point H (that is, the curve between the previous voltage value at point H and point H) is smaller than the preset slope, and the absolute value of the second slope on the curve to the right of point H at point H (that is, the curve between the next voltage value of point H and point H) is greater than or equal to the preset slope; therefore, point H is a voltage jump point of the voltage signal of phase B.

In an embodiment of the present invention, a preset slope may be greater than the slope of the zero-crossing point in the voltage signal of a target phase input to the circuit breaker. Specifically, a preset slope may be 2 times-3 times the slope of the zero-crossing point in the voltage signal of a target phase input to the circuit breaker, wherein the zero-crossing point of the voltage signal of the target phase is the point at which the voltage value of the voltage signal of the target phase is 0 after switch-on. Specifically, 2 times-3 times the slope of the curve of the voltage signal at this point may be obtained as a preset slope.

In an embodiment of the present invention, determining the closing time of a target phase of the circuit breaker according to the found sampling time of the voltage jump point comprises:

determining a first time when the circuit breaker receives a closing instruction corresponding to the target phase;

determining a second time when the last voltage jump point appears in the first time period; and taking the length of time between the first time and the target sampling time as the closing time of the target phase of the circuit breaker.

In an embodiment of the present invention, when there is only one voltage jump point in the first time period, the voltage jump point is the last voltage jump point in the first time period. As shown in FIG. 3, point E is the only voltage jump point in the first time period.

When two or more voltage jump points appear in the first time period, the voltage jump points before the last voltage jump point are all located in the disturbance of the voltage signal of the target phase, for example, point F shown in FIG. 4. The last voltage jump point is the voltage jump point at the switch-on time, for example, point H shown in FIG. 4.

If a search is performed for a voltage jump point in the first time period, it is possible that no voltage jump point will be found. In this case, the closing time of a target phase may be determined in the following manner:

In an embodiment of the present invention, the method further comprises:

determining a first time when the circuit breaker receives a closing instruction corresponding to the target phase;

determining the absolute value of a voltage value of the sampled voltage signal, and determining a second time period during which the absolute value of the voltage value is greater than or equal to a first preset voltage threshold value for n seconds consecutively for the first time;

if no voltage jump point is found in the first time period, searching, from back to front, the time period before the start time of the second time period to determine the first target sampling time found that is smaller than or equal to a voltage value of a second preset voltage threshold value; and taking the length of time between the first time and the target sampling time as the closing time of the target phase of the circuit breaker, wherein n is a preset positive number, and both the first preset voltage threshold value and the second preset voltage threshold value are positive numbers.

In an embodiment of the present invention, after the second time period is determined, a search is performed forward from the start time of the second time period until the target sampling time is found. Since the search is performed from back to front, the target sampling time is the latest sampling time among at least one voltage value that is smaller than or equal to a second preset voltage threshold value in a time period earlier than the start time of the second time period.

Figure 5:
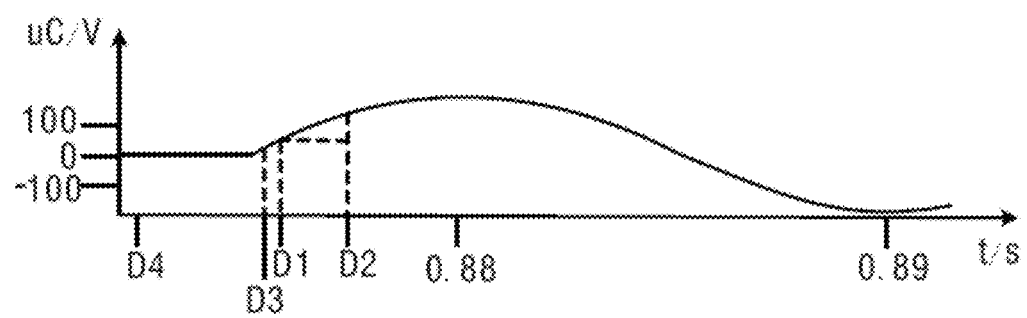
FIG. 5 is a waveform diagram for a phase C voltage signal output by a circuit breaker according to an embodiment of the present invention.

See FIG. 5; FIG. 5 shows a waveform diagram for a voltage signal of phase C output by a circuit breaker. As shown in the figure, the second time period is from time D1 to time D2, time D1 is the start time of the second time period, and the second preset voltage threshold value is 2v; then, starting from time D1, the time period earlier than time D1 is searched, and the first found target sampling time of a voltage lower than or equal to 2v is time D3. Time D3 is also the latest sampling time among at least one voltage value that is smaller than or equal to the second preset voltage threshold value in the time period earlier than time D1. FIG. 5 also shows the first time when the circuit breaker receives a closing instruction corresponding to phase C, and the first time is time D4. The closing time of the voltage signal of phase C is the length of time from time D4 to time D3.

In an embodiment of the present invention, the value range of the first preset voltage threshold value is [v1, v2), where v1 is 0.2 times the rated secondary voltage of the transformer that inputs the three-phase voltage signal to the circuit breaker, and v2 is the maximum value of a voltage signal of a target phase input to the circuit breaker. The value range of n is [0.003, 0.006].

In an embodiment of the present invention, the value range of a second preset voltage threshold value may be greater than 0 and smaller than or equal to 2% times the rated secondary voltage of the transformer that inputs the three-phase voltage signal to the circuit breaker.

Figure 6:
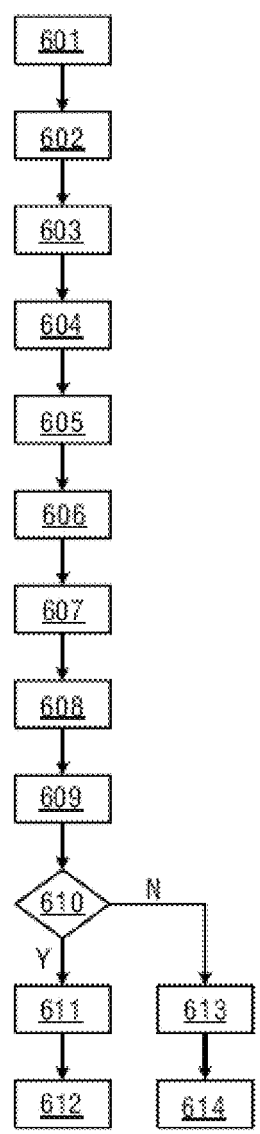
FIG. 6 is a flowchart for another method for determining the closing time of a circuit breaker according to an embodiment of the present invention.

A method for determining the closing time of a circuit breaker provided by an embodiment of the present invention will be described in detail below with reference to a specific embodiment. In an embodiment of the present invention, a transformer inputs voltage signals to the three phases of a circuit breaker, and each phase of the circuit breaker outputs a voltage signal of the target phase after being closed. As shown in FIG. 6, the method may comprise the following steps:

Step 601: Sample a voltage signal of a target phase in a three-phase voltage signal of the circuit breaker.

Specifically, an output voltage signal of a target phase of the circuit breaker is sampled. The value range of sampling frequency may be [1 kHz, 8 kHz].

Sampling may be started before any phase of the circuit breaker is switched on.

Step 602: Determine the absolute value of the voltage value of the voltage signal of the sampled target phase.

Step 603: Determine a second time period during which the absolute value of the voltage value of a voltage signal of a target phase is greater than or equal to a first preset voltage threshold value for n seconds consecutively for the first time, where n is a preset positive number and the first preset voltage threshold value is a positive number.

Specifically, the value range of n is [0.003, 0.006]; for example, n has a value of 0.003.

The value range of the first preset voltage threshold value is [v1, v2), where v1 is 0.2 times the rated secondary voltage of the transformer that inputs the three-phase voltage signal to the circuit breaker, and v2 is the maximum value of a voltage signal of a target phase input to the circuit breaker.

When the voltage signal of the target phase input to the circuit breaker is a sinusoidal voltage signal, the maximum value is the peak voltage value of the sinusoidal voltage signal.

Specifically, this step may be performed along with the sampling. Whenever the voltage value of the voltage signal of the target phase is sampled, determine whether the absolute value of the voltage value is greater than a first preset voltage threshold value; if yes, check whether the length of time during which the value is consecutively greater than or equal to the first preset voltage threshold value has reached n seconds; if it has reached n seconds, then determine the second time period; if it has not reached n seconds, then proceed with the processing of the next sampled voltage value.

Step 604: Determine the time at which the second time period ends as a jump reference time.

Time A5 shown in FIG. 3 and time B5 shown in FIG. 4 can both be used as the jump reference time.

Step 605: Determine an instruction receiving time when the circuit breaker receives a closing instruction corresponding to the target phase.

Specifically, on receiving a closing instruction, the circuit breaker records the instruction receiving time at which the closing instruction is received, and the instruction receiving time may be obtained from the circuit breaker. For example, on receiving a closing instruction, the circuit breaker records the instruction receiving time of the closing instruction in a log; a request may be sent to the circuit breaker to obtain the instruction receiving time; the circuit breaker will find the instruction receiving time from the log and then return the instruction receiving time.

Step 605 only needs to be performed before Step 612 and Step 614, not subject to any specific sequence requirement.

As shown in FIG. 4, time B9 in FIG. 4 is the instruction receiving time of the voltage signal of phase B.

Step 606: Take the time p voltage cycles before the jump reference time as the start time.

Specifically, p can be 1 or 2. When p is 1, the start time is one cycle earlier than the jump reference time. As shown in FIG. 4, the cycle of the voltage signal of phase B input to the circuit breaker is 0.01 seconds; then, when p is 1, the start time is 0.01 seconds earlier than time B5, that is, time B7.

Step 607: Take the time q voltage cycles after the jump reference time as the end time.

Specifically, q can be 1 or 2. When q is 1, the start time is one cycle later than the jump reference time. As shown in FIG. 4, the cycle of the voltage signal of phase B input to the circuit breaker is 0.01 seconds; then, when p is 1, the start time is 0.01 seconds later than time B5, that is, time B8.

The voltage cycle is the cycle of the voltage signal of the target phase input to the circuit breaker.

Step 608: Determine the time period from the start time to the end time as the first time period.

As shown in FIG. 4, the first time period is from time B7 to time B8.

Step 609: For each voltage value of the voltage signal of the target phase in the first time period, determine a first slope of the current voltage value on a first curve, determine a second slope of the current voltage value on a second curve, and determine whether the current voltage value meets the following condition: the absolute value of the first slope corresponding to the current voltage value is smaller than a preset slope, and the absolute value of the second slope corresponding to the current voltage value is greater than or equal to the preset slope; if yes, then it is determined that the current voltage value is a voltage jump point; otherwise, it is determined that the current voltage value is not a voltage jump point.

Specifically, a preset slope is greater than the slope of the zero-crossing point in the voltage signal of the target phase input to the circuit breaker.

A first curve comprises a curve between the previous voltage value of the current voltage value and the current voltage value; a second curve comprises a curve between the next voltage value of the current voltage value and the current voltage value.

As shown in FIG. 4, from the first time period shown in FIG. 4, it may be determined that point F and point H are two voltage jump points.

Step 610: Determine whether there is a voltage jump point in the first time period; if yes, go to Step 611; otherwise, go to Step 613.

As shown in FIG. 4, the voltage signal of phase B in FIG. 4 has two voltage jump points: point F and point H.

As shown in FIG. 5, the voltage signal of phase C in FIG. 5 has no voltage jump point.

Step 611: Determine a second time when the last voltage jump point appears in the first time period, and perform step 612.

As shown in FIG. 4, point F in FIG. 4 is the last voltage jump point of the voltage signal of phase B in the first time period, and the second time of the voltage signal of phase B is the sampling time of point F, that is, time B3.

Step 612: Take the length of time between the instruction receiving time and the second time as the closing time of the target phase of the circuit breaker.

As shown in FIG. 4, the time period from time B9 to time B3 is the closing time of the voltage signal of phase B.

Step 613: Search, from back to front, the time period before the start time of the second time period to determine the first target sampling time found that is smaller than or equal to a voltage value of a second preset voltage threshold value.

As shown in FIG. 5, a search is performed from back to front starting from time D1, and the target sampling time found is time D3.

Step 614: Take the length of time between the instruction receiving time and the target sampling time as the closing time of the target phase of the circuit breaker.

As shown in FIG. 5, the length of time from time D4 to time D3 is the closing time of phase C of the circuit breaker.

Figure 7:
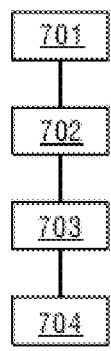
FIG. 7 is a schematic diagram for a device for determining the closing time of a circuit breaker according to an embodiment of the present invention.

As shown in FIG. 7, an embodiment of the present invention provides a device for determining the closing time of a circuit breaker, the circuit breaker outputting a three-phase voltage signal, the device comprising: a sampling module 701, a first time period determination module 702, and a jump point search module 703, and a first closing time determination module 704;

wherein the sampling module 701 is configured to sample a voltage signal of a target phase in the three-phase voltage signal of the circuit breaker;

the first time period determination module 702 is configured to determine a first time period according to a voltage value of the sampled voltage signal, a voltage signal in the first time period comprising a voltage jump point of a voltage value;

the jump point search module 703 is configured to find a voltage jump point of a voltage value in the first time period according to a change in a voltage value of the voltage signal in the first time period; and the first closing time determination module 704 is configured to determine the closing time of the target phase of the circuit breaker according to the found sampling time of the voltage jump point.

Figure 8:
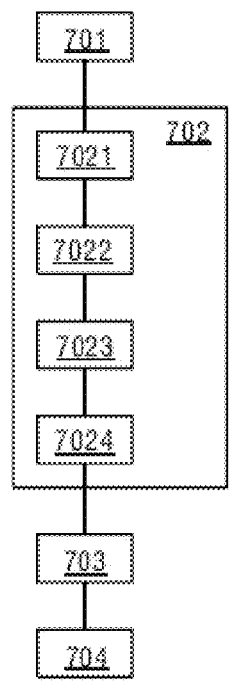
FIG. 8 is a schematic diagram for another device for determining the closing time of a circuit breaker according to an embodiment of the present invention.

Based on a device for determining the closing time of a circuit breaker shown in FIG. 7, as shown in FIG. 8, in an embodiment of the present invention, the first time period determination module 702 comprises a voltage value determination unit 7021, a second time period determination unit 7022, a reference time determination unit 7023, and a first time period determination unit 7024;

wherein the voltage value determination unit 7021 is configured to determine the absolute value of a voltage value of the sampled voltage signal;

the second time period determination unit 7022 is configured to determine a second time period during which the absolute value of the voltage value is greater than or equal to a first preset voltage threshold value for n seconds consecutively for the first time, where n is a preset positive number and the first preset voltage threshold value is a positive number;

the reference time determination unit 7023 is configured to determine any time in the second time period as a jump reference time; and the first time period determination unit 7024 is configured to determine the first time period according to the jump reference time.

In an embodiment of the present invention, the reference time determination unit 7023 is configured to determine the time at which the second time period ends as a jump reference time.

In an embodiment of the present invention, the value range of the first preset voltage threshold value is [v1, v2), where v1 is 0.2 times the rated secondary voltage of the transformer that inputs the three-phase voltage signal to the circuit breaker, and v2 is the maximum value of a voltage signal of a target phase input to the circuit breaker.

In an embodiment of the present invention, the value range of n is [0.003, 0.006].

Figure 9:
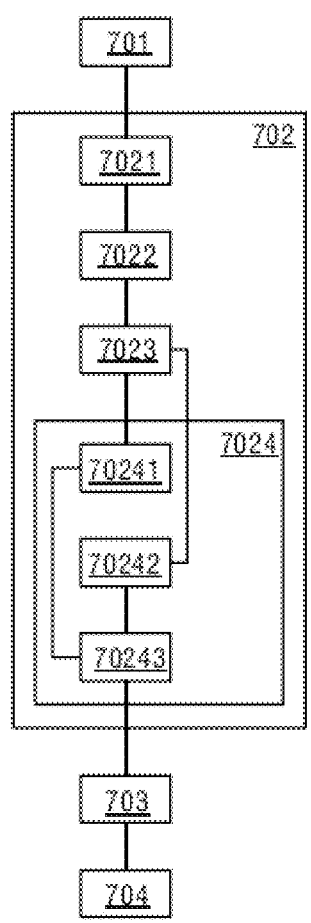
FIG. 9 is a schematic diagram for yet another device for determining the closing time of a circuit breaker according to an embodiment of the present invention.

Based on a device for determining the closing time of a circuit breaker shown in FIG. 8, as shown in FIG. 9, in an embodiment of the present invention, the first time period determination unit 7024 comprises: a start time determination subunit 70241, an end time determination subunit 70242, and a first time period determination subunit 70243;

wherein the start time determination subunit 70241 is configured to take the time p voltage cycles before the jump reference time as the start time;

the end time determination subunit 70242 is configured to take the time q voltage cycles after the jump reference time as the end time; and the first time period determination subunit 70243 is configured to determine the time period from the start time to the end time as the first time period;

wherein p and q are positive numbers, and the voltage cycle is the cycle of a voltage signal of a target phase input to the circuit breaker.

In an embodiment of the present invention, the jump point search module 703 is configured to, for each voltage value of the voltage signal of the target phase in the first time period:

determine a first slope of the current voltage value on a first curve, the first curve comprising a curve between the previous voltage value of the current voltage value and the current voltage value;

determine a second slope of the current voltage value on a second curve, the second curve comprising a curve between the next voltage value of the current voltage value and the current voltage value;

determine whether the current voltage value satisfies the following condition: the absolute value of the first slope corresponding to the current voltage value is smaller than a preset slope, and the absolute value of the second slope corresponding to the current voltage value is greater than or equal to the preset slope; if yes, it is determined that the current voltage value is a voltage jump point; otherwise, it is determined that the current voltage value is not a voltage jump point, where the preset slope is a positive number.

Figure 10:
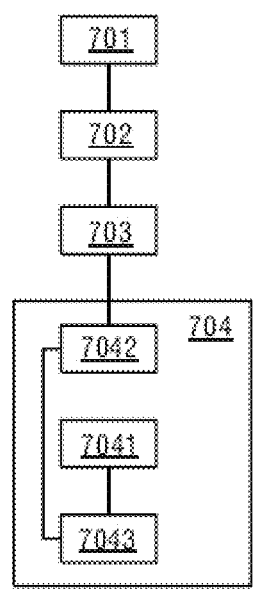
FIG. 10 is a schematic diagram for still another device for determining the closing time of a circuit breaker according to an embodiment of the present invention.

Based on a device for determining the closing time of a circuit breaker shown in FIG. 7, as shown in FIG. 10, in an embodiment of the present invention, the first closing time determination module 704 comprises: a first time determination unit 7041, a second time determination unit 7042, and a closing data determination unit 7043;

wherein the first time determination unit 7041 is configured to determine a first time when the circuit breaker receives a closing instruction corresponding to the target phase;

the second time determination unit 7042 is configured to determine a second time when the last voltage jump point appears in the first time period; and the closing data determination unit 7043 is configured to take the length of time between the first time and the second time as the closing time of the target phase of the circuit breaker.

Figure 11:
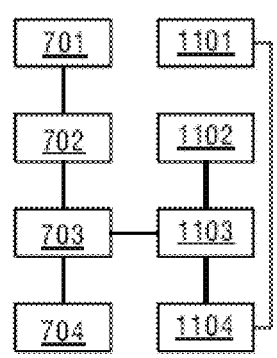
FIG. 11 is a schematic diagram for further another device for determining the closing time of a circuit breaker according to an embodiment of the present invention.

Based on a device for determining the closing time of a circuit breaker shown in FIG. 7, as shown in FIG. 11, in an embodiment of the present invention, a device for determining the closing time of a circuit breaker provided by an embodiment of the present invention further comprises a first time determination module 1101, a second time period determination module 1102, a target sampling time determination module 1103, and a second closing time determination module 1104;

wherein the first time determination module 1101 is configured to determine a first time when the circuit breaker receives a closing instruction corresponding to the target phase;

the second time period determination module 1102 is configured to determine the absolute value of a voltage value of the sampled voltage signal, and determine a second time period during which the absolute value of the voltage value is greater than or equal to a first preset voltage threshold value for n seconds consecutively for the first time;

the target sampling time determination module 1103 is configured to, if the jump point search module 703 fails to find the voltage jump point within the first time period, search, from back to front, the time period before the start time of the second time period to determine the first target sampling time found that is smaller than or equal to a voltage value of a second preset voltage threshold value; and the second closing time determination module 1104 is configured to take the length of time between the first time and the target sampling time as the closing time of the target phase of the circuit breaker, wherein n is a preset positive number, and both the first preset voltage threshold value and the second preset voltage threshold value are positive numbers.

An embodiment of the present invention provides a device for determining the closing time of a circuit breaker, comprising: at least one memory and at least one processor;

the at least one memory is configured to store a machine-readable program; and the at least one processor is configured to invoke a machine-readable program to implement any method for determining the closing time of a circuit breaker provided in an embodiment of the present invention.

An embodiment of the present invention provides a computer-readable medium storing a computer instruction that, when executed by a processor, causes the processor to implement any one of the methods described in embodiments of the present invention.

It is understandable that a structure illustrated in an embodiment of the present invention does not constitute a specific limitation on a device for determining the closing time of a circuit breaker. In other embodiments of the present invention, a device for determining the closing time of a circuit breaker may comprise more or fewer components than shown herein, or a combination of certain components, or splitting of certain components, or arrangement of different components. An illustrated component may be implemented by hardware, software, or a combination of software and hardware.

The information exchange and execution process among the units in the abovementioned device are based on the same concept as a method embodiment of the present invention. For specific content, see the description of the method embodiment of the present invention, and no details will be given again herein.

The present invention further provides a computer-readable medium storing an instruction for causing a computer to execute a method for determining the closing time of a circuit breaker as described herein. Specifically, a system or device equipped with a storage medium may be provided, software program code for fulfilling the functions of any one of the above-described embodiments being stored in the storage medium, and a computer (or CPU or MPU) of the system or device is caused to read and execute the program code stored in the storage medium.

In this case, the program code itself read from the storage medium can fulfill the functions of any one of the above-described embodiments; therefore, program code and the storage medium storing the program code constitute a part of the present invention.

Examples of storage media for providing program code include floppy disks, hard disks, magneto-optical disks, optical disks (such as CD-ROMs, CD-Rs, CD-RWs, DVD-ROMs, DVD-RAMs, DVD-RWs, and DVD+RWs), magnetic tapes, non-volatile memory cards, and ROMs. Optionally, program code may be downloaded from a server computer via a communications network.

In addition, it should be made clear that functions of any one of the above-described embodiments may be implemented not only by executing program code read by a computer but also by causing, according to an instruction given by program code, an operating system, etc. running on a computer to complete part or all of actual operations.

In addition, it can be understood that functions of any one of the above-described embodiments may be implemented by writing program code read from a storage medium to a memory disposed in an expansion board inserted into a computer or to a memory disposed in an expansion unit connected to a computer, and then by, according to the instruction of program code, causing a CPU, etc. installed on the expansion board or expansion unit to execute part or all of actual operations.

It should be noted that not all the steps or modules in the above-described flows and system structural diagrams are required, and certain steps or modules may be omitted as needed. The sequence of executing steps is not fixed and may be adjusted as needed. The system structures described in the above embodiments may be physical structures or logical structures; in other words, certain modules may be implemented as the same physical entity, or certain modules may be implemented as at least two physical entities separately, or certain modules may be jointly implemented by certain components in at least two standalone devices.

In each of the above embodiments, a hardware unit may be implemented mechanically or electrically. For example, a hardware unit may comprise a permanently dedicated circuit or logic, for example, a special processor, an FPGA, or an ASIC, for completing corresponding operations. A hardware unit may further comprise programmable logic or circuitry (for example, a general-purpose processor or any other programmable processor), which may be temporarily configured by software to perform corresponding operations. Specific implementations (mechanical, or dedicated permanent circuits, or temporarily configured circuits) may be determined on the basis of cost and time considerations.

While the present invention has been described and illustrated in detail above with reference to the drawings and preferred embodiments, the present invention is not limited to these disclosed embodiments, and more embodiments of the present invention may be obtained by combining the code auditing means in the different embodiments described above, as may be appreciated by those of ordinary skill in the art based on the abovementioned embodiments; these embodiments also fall within the protection scope of the present invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for determining a closing time of a target phase of a circuit breaker, the circuit breaker being configured to output a three-phase voltage signal, the method comprising:
    sampling a voltage signal of the target phase in the three-phase voltage signal of the circuit breaker;
    determining a first time period based on a voltage value of the voltage signal, the voltage signal in the first time period including a voltage jump point of the voltage value;
    finding the voltage jump point based on a change in the voltage value in the first time period, the finding the voltage jump point including,
        determining a first slope of the voltage value on a first curve, the first curve being between the voltage value and a preceding voltage value,
        determining a second slope of the voltage value on a second curve, the second curve being between the voltage value and a succeeding voltage value,
        comparing an absolute value of the first slope to a preset slope, and an absolute value of the second slope to the preset slope, the preset slope being a positive number, and
        determining the voltage value as the voltage jump point based on the absolute value of the first slope being less than the preset slope and the absolute value of the second slope being greater than or equal to the preset slope; and
    determining closing time of the target phase of the circuit breaker based on a sampling time of the voltage jump point.

2. The method of claim 1, wherein the determining the first time period comprises:
    determining an absolute value of the voltage value;
    determining a second time period during which the absolute value of the voltage value is greater than or equal to a first voltage threshold value for N seconds consecutively for a chronological first time, N being a first positive number and the first voltage threshold value is being a first positive number;
    determining a time in the second time period as a jump reference time; and
    determining the first time period based on the jump reference time.

3. The method of claim 2, wherein the determining the time in the second time period as the jump reference time comprises:
    determining an end time of the second time period as the jump reference time.

4. The method of claim 2, wherein
    the first voltage threshold value is at least 0.2 times a rated secondary voltage of a transformer configured to input the three-phase voltage signal to the circuit breaker, and is at most a maximum value of the voltage signal of the target phase input to the circuit breaker, and
    N is between 0.003 and 0.006.

5. The method of claim 2, wherein the determining the first time period based on the jump reference time comprises:
    taking a time at P voltage cycles before the jump reference time as a start time, P being a third positive number, and a voltage cycle of the P voltage cycles being a cycle of the voltage signal of the target phase input to the circuit breaker;
    taking a time at Q voltage cycles after the jump reference time as an end time, Q being a fourth positive number; and
    determining the first time period as a difference between the start time and the end time.

6. The method of claim 1, wherein the finding of the voltage jump point further includes,
    determining that the voltage value is not a voltage jump point based on the absolute value of the first slope being greater than or equal to the preset slope or the absolute value of the second slope being less than the preset slope.

7. The method of claim 1, wherein the determining the closing time of the target phase of the circuit breaker comprises:
    determining a first time at which the circuit breaker receives a closing instruction for the target phase;
    determining a second time at which a last voltage jump point appears in the first time period; and
    taking a length of time between the first time and the second time as the closing time of the target phase of the circuit breaker.

8. The method of claim 1, further comprising:
determining a first time at which the circuit breaker receives a closing instruction for the target phase;
determining an absolute value of the voltage value; and
determining a second time period during which the absolute value of the voltage value is greater than or equal to a first voltage threshold value for N seconds consecutively for a chronological first time, N being a first positive number and the first voltage threshold value being a second positive number;
in response to the voltage jump point not being found in the first time period, searching a time period before a start time of the second time period, and determining a first target sampling time having a corresponding voltage value smaller than or equal to a second voltage threshold value, the second voltage threshold value being a third positive number; and
taking a length of time between the first time and the first target sampling time as the closing time of the target phase of the circuit breaker.

9. A non-transitory computer-readable medium, storing a computer instruction that, when executed by a processor, causes the processor to implement the method of claim 1.

10. A device for determining a closing time of a target phase of a circuit breaker, the circuit breaker being configured to output a three-phase voltage signal, the device comprising:
a sampling module configured to sample a voltage signal of the target phase in the three-phase voltage signal;
a first time period determination module configured to determine a first time period based on a voltage value of the voltage signal, the voltage signal in the first time period including a voltage jump point of the voltage value;
a jump point search module configured to
determine a first slope of the voltage value on a first curve, the first curve including a curve between the voltage value and a preceding voltage value,
determine a second slope of the voltage value on a second curve, the second curve being between the voltage value and a succeeding voltage value,
compare an absolute value of the first slope to a preset slope, and an absolute value of the second slope to the preset slope, the preset slope being a positive number, and
determine the voltage value as the voltage jump point based on the absolute value of the first slope being less than the preset slope; and
a first closing time determination module configured to determine the closing time of the target phase of the circuit breaker based on a sampling time of the voltage jump point.

11. The device of claim 10, wherein the first time period determination module comprises:
a voltage value determination unit configured to determine an absolute value of a voltage value;
a second time period determination unit configured to determine a second time period during which the absolute value of the voltage value is greater than or equal to a first voltage threshold value for N seconds consecutively for a chronological first time, N being a first positive number and the first voltage threshold value being a second positive number;
a reference time determination unit configured to determine a time in the second time period as a jump reference time; and
a first time period determination unit configured to determine the first time period based on the jump reference time.

12. The device of claim 11, wherein the reference time determination unit is configured to determine an end time of the second time period as the jump reference time.

13. The device of claim 11, wherein
the first voltage threshold value is at least 0.2 times a rated secondary voltage of a transformer configured to input the three-phase voltage signal to the circuit breaker, and is at most a maximum value of the voltage signal of the target phase input to the circuit breaker, and
N is between 0.003 and 0.006.

14. The device of claim 11, wherein the first time period determination unit comprises:
a start time determination subunit configured to take a time at P voltage cycles before the jump reference time as a start time, P being a third positive number, and a voltage cycle of the P voltage cycles being a cycle of the voltage signal of the target phase input to the circuit breaker;
an end time determination subunit configured to take a time at Q voltage cycles after the jump reference time as an end time, Q being a fourth positive number; and
a first time period determination subunit configured to determine the first time period as a difference between the start time and the end time.

15. The device of claim 10, wherein, the jump point search module is further configured to determine that the voltage value is not the voltage jump point based on the absolute of the first slope being greater than or equal to the preset slope or the absolute value of the second slope being less than the preset slope.

16. The device of claim 10, wherein the first closing time determination module comprises:
a first time determination unit configured to determine a first time at which the circuit breaker receives a closing instruction for the target phase;
a second time determination unit configured to determine a second time at which a last voltage jump point appears in the first time period; and
a closing data determination unit configured to take a length of time between the first time and the second time as the closing time of the target phase of the circuit breaker.

17. The device of claim 10, further comprising:
a first time determination module configured to determine a first time at which the circuit breaker receives a closing instruction for the target phase;
a second time period determination module configured to, determine an absolute value of the voltage value, and determine a second time period during which the absolute value of the voltage value is greater than or equal to a first voltage threshold value for N seconds consecutively for a chronological first time, N being a first positive number and the first voltage threshold value being a second positive number;
a target sampling time determination module configured to, in response to the jump point search module not finding the voltage jump point in the first time period, search a time period before a start time of the second time period to determine a first target sampling time having a corresponding voltage value less than or equal to a second voltage threshold value, the second voltage threshold value being a third positive number; and
a second closing time determination module configured to take a length of time between the first time and the first target sampling time as the closing time of the target phase of the circuit breaker.

18. A device for determining a closing time of a target phase of a circuit breaker, the device comprising:
one or more processors; and
a memory storing computer-executable instructions that, when executed by the one or more processors, causes the device to:
sample a voltage signal of the target phase in a three-phase voltage signal of a circuit breaker,
determine a first time period based on a voltage value of the voltage signal, the voltage signal in the first time period including a voltage jump point of the voltage value,
determine a first slope of the voltage value on a first curve, the first curve being between the voltage value and a preceding voltage value,
determine a second slope of the voltage value on a second curve, the second curve being between the voltage value and a succeeding voltage value,
compare an absolute value of the first slope to a preset slope, and an absolute value of the second slope to the preset slope, the preset slope being a positive number, and
determine the voltage value as the voltage jump point based on the absolute value of the first slope being less than the preset slope and the absolute value of the second slope being greater than or equal to the preset slope; and
determine the closing time of the target phase of the circuit breaker based on a sampling time of the voltage jump point.

19. The device of claim 18, wherein the memory stores computer-executable instructions that when executed by the one or more processors, cause the device to determine the first time period by:
determining an absolute value of the voltage value;
determining a second time period during which the absolute value of the voltage value is greater than or equal to a first voltage threshold value for N seconds consecutively for a chronological first time, N being a first positive number and the first voltage threshold value being a second positive number;
determining a time in the second time period as a jump reference time; and
determining the first time period based on the jump reference time.

20. The device of claim 19, wherein the determining of the time in the second time period as the jump reference time comprises:
determining an end time of the second time period as the jump reference time.

* * * * *